US009876089B2

(12) United States Patent
Cho et al.

(10) Patent No.: US 9,876,089 B2
(45) Date of Patent: Jan. 23, 2018

(54) HIGH-K AND P-TYPE WORK FUNCTION METAL FIRST FABRICATION PROCESS HAVING IMPROVED ANNEALING PROCESS FLOWS

(71) Applicants: International Business Machines Corporation, Armonk, NY (US); GlobalFoundries, Inc., Grand Cayman (KY)

(72) Inventors: Jin Cho, Palo Alto, CA (US); MiaoMiao Wang, Albany, NY (US); Hui Zang, Guilderland, NY (US)

(73) Assignees: INTERNATIONAL BUSINESS MACHINES CORPORATION, Armonk, NY (US); GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/183,390

(22) Filed: Jun. 15, 2016

(65) Prior Publication Data
US 2017/0025526 A1  Jan. 26, 2017

Related U.S. Application Data

(62) Division of application No. 14/805,527, filed on Jul. 22, 2015.

(51) Int. Cl.
*H01L 27/088* (2006.01)
*H01L 29/51* (2006.01)
(Continued)

(52) U.S. Cl.
CPC ...... *H01L 29/513* (2013.01); *H01L 21/28026* (2013.01); *H01L 21/324* (2013.01);
(Continued)

(58) Field of Classification Search
CPC ............. H01L 29/66795; H01L 29/785; H01L 27/10802; H01L 27/10826;
(Continued)

(56) References Cited

U.S. PATENT DOCUMENTS

2006/0084247 A1* 4/2006 Liu ................... H01L 21/28097
438/510
2008/0274598 A1* 11/2008 Ramin .............. H01L 21/28026
438/231
(Continued)

OTHER PUBLICATIONS

Veloso et al., "Integration Challenges and Options of Replacement High-K/Metal Gate Technology for (Sub-) 22nm Technology Nodes," ECS Transactions, vol. 52, No. 1, 2013, pp. 385-390.*
(Continued)

*Primary Examiner* — Robert Bachner
(74) *Attorney, Agent, or Firm* — Cantor Colburn LLP; Vazken Alexanian

(57) ABSTRACT

Embodiments are directed to a method of forming portions of a fin-type field effect transistor (FinFET). The method includes forming at least one fin, and forming a dielectric layer over at least a portion of the at least one fin. The method further includes forming a work function layer over at least a portion of the dielectric layer. The method further includes forming a source region or a drain region adjacent the at least one fin, and performing an anneal operation, wherein the anneal operation anneals the dielectric layer and either the source region or the drain region, and wherein the work function layer provides a protection function to the at least a portion of the dielectric layer during the anneal operation.

20 Claims, 8 Drawing Sheets

(51) Int. Cl.
| | |
|---|---|
| *H01L 29/66* | (2006.01) |
| *H01L 29/78* | (2006.01) |
| *H01L 29/417* | (2006.01) |
| *H01L 21/28* | (2006.01) |
| *H01L 21/324* | (2006.01) |
| *H01L 29/49* | (2006.01) |

(52) U.S. Cl.
CPC ...... *H01L 29/41791* (2013.01); *H01L 29/495* (2013.01); *H01L 29/4966* (2013.01); *H01L 29/517* (2013.01); *H01L 29/66545* (2013.01); *H01L 29/66795* (2013.01); *H01L 29/785* (2013.01)

(58) Field of Classification Search
CPC ........... H01L 27/10879; H01L 29/7841; H01L 29/94; H01L 29/4966; H01L 29/513; H01L 29/517; H01L 21/28026; H01L 21/324; H01L 29/41791
See application file for complete search history.

(56) References Cited

U.S. PATENT DOCUMENTS

2011/0151655 A1* 6/2011 Chan ................. H01L 21/28079
 438/589
2011/0260257 A1* 10/2011 Jagannathan ....... H01L 27/0924
 257/369
2013/0102130 A1 4/2013 Cheng et al.

OTHER PUBLICATIONS

List of IBM Patents or Patent Applications Treated as Related, U.S. Appl. No. 15/183,390, filed Jun. 15, 2016, 2 Pages.

U.S. Appl. No. 14/805,527, filed Jul. 22, 2016; "High-K and P-Type Work Function Metal First Fabrication Process Having Improved Annealing Process Flows".

* cited by examiner

HIGH-K AND P-TYPE WORK FUNCTION METAL FIRST FABRICATION PROCESS HAVING IMPROVED ANNEALING PROCESS FLOWS

DOMESTIC PRIORITY

This application is a division of U.S. application Ser. No. 14/805,527, entitled "HIGH-K AND P-TYPE WORK FUNCTION METAL FIRST FABRICATION PROCESS HAVING IMPROVED ANNEALING PROCESS FLOWS," filed Jul. 22, 2015, the disclosure of which is incorporated by reference herein in its entirety.

BACKGROUND

The present disclosure relates in general to semiconductor device structures and their fabrication. More specifically, the present disclosure relates to the fabrication of a fin-type field effect transistor (FinFET) using a high-k and p-type work function metal first fabrication process that improves, inter alia, source/drain activation annealing and dielectric reliability annealing.

Typical semiconductor devices are formed using active regions of a wafer. The active regions are defined by isolation regions used to separate and electrically isolate adjacent semiconductor devices. For example, in an integrated circuit having a plurality of metal oxide semiconductor field effect transistors (MOSFETs), each MOSFET has a source and a drain that are formed in an active region of a semiconductor layer by implanting n-type or p-type impurities in the layer of semiconductor material. Disposed between the source and the drain is a channel (or body) region. Disposed above the body region is a gate electrode. The gate electrode and the body are spaced apart by a gate dielectric layer.

One particularly advantageous type of MOSFET is known generally as a fin-type field effect transistor (FinFET). FIG. 1A depicts a three-dimensional view of an exemplary Fin-FET 100, which includes a shallow trench isolation (STI) region 104 for isolation of active areas from one another. The basic electrical layout and mode of operation of FinFET 100 do not differ significantly from a traditional field effect transistor. FinFET 100 includes a semiconductor substrate 102, local STI region 104, a fin 106, and a gate 114 having a gate oxide layer (not shown) between the gate and the fin, configured and arranged as shown. Fin 106 includes a source region 108, a drain region 110 and a channel region 112, wherein gate 114 extends over the top and sides of channel region 112. For ease of illustration, a single fin is shown in FIG. 1. In practice, FinFET devices are fabricated having multiple fins formed on local STI region 104 and substrate 102. Substrate 102 may be silicon, and local STI region 104 may be an oxide (e.g., $SiO_2$). Fin 106 may be silicon. Gate 114 controls the source to drain current flow (labeled ELECTRICITY FLOW in FIG. 1). In contrast to a planar MOSFET, however, source 108, drain 110 and channel 112 are built as a three-dimensional bar on top of local STI region 104 and semiconductor substrate 102. The three-dimensional bar is the aforementioned "fin 106," which serves as the body of the device. The gate electrode is then wrapped over the top and sides of the fin, and the portion of the fin that is under the gate electrode functions as the channel. The source and drain regions are the portions of the fin on either side of the channel that are not under the gate electrode. The source and drain regions may be suitably doped to produce the desired FET polarity, as is known in the art. The dimensions of the fin establish the effective channel length for the transistor.

Transistors have been made with silicon dioxide gate dielectrics and poly-silicon gate conductors for decades. However, as transistors have decreased in size, gate dielectric thickness has scaled below 2 nanometers, which increases tunneling leakage currents and power consumption and reduces device reliability. Replacing the silicon dioxide gate dielectric with a high-k material having a high dielectric constant (k) in comparison to silicon dioxide allows increases gate capacitance without the associated leakage effects. Suitable high-k materials include hafnium silicate, zirconium silicate, hafnium dioxide and zirconium dioxide, typically deposited using atomic layer deposition.

Replacing the silicon dioxide gate dielectric with another material adds complexity to the fabrication process. For example, implementing the gate dielectric based on high-k oxides of hafnium requires the poly-silicon gate material to be replaced with a metal that interfaces better with the high-k dielectric. Accordingly, the poly-silicon gate must be etched out and replaced with metal. The metal-gate may be formed before or after the source and drain regions. Forming the metal gate last (i.e., after formation of the source and drain regions) is known generally as a replacement metal gate (RMG) process flow.

Known process flows for the metal gate formation involves independently optimized complex stacks of thin work-function metals topped by a bulk conductor layer. Additionally, a typical fabrication process flow includes multiple annealing operations, including, for example, a high-k post-deposition anneal (PDA), a high temperature anneal applied to the high-k dielectric to improve reliability, and a high temperature source drain anneal applied to the doped source and drain regions to activate these regions.

SUMMARY

Embodiments are directed to a method of forming portions of a fin-type field effect transistor (FinFET). The method includes forming at least one fin, and forming a dielectric layer over at least a portion of the at least one fin. The method further includes forming a work-function layer over at least a portion of the dielectric layer. The method further includes forming a source region or a drain region adjacent the at least one fin, and performing an anneal operation, wherein the anneal operation anneals the dielectric layer and either the source region or the drain region, and wherein the work function layer provides a protection function to the at least a portion of the dielectric layer during the anneal operation.

Embodiments are further directed to a FinFET device having at least one fin, a dielectric layer over at least a portion of the at least one fin, and a source region or a drain region adjacent the at least one fin, wherein, during a fabrication of the device, one anneal operation annealed the dielectric layer and the source region or the drain region.

Additional features and advantages are realized through techniques described herein. Other embodiments and aspects are described in detail herein. For a better understanding, refer to the description and to the drawings.

BRIEF DESCRIPTION OF THE DRAWINGS

The subject matter which is regarded as embodiments is particularly pointed out and distinctly claimed in the claims at the conclusion of the specification. The foregoing

DETAILED DESCRIPTION

It is understood in advance that although this disclosure includes a detailed description of an exemplary FinFET configuration, implementation of the teachings recited herein are not limited to the particular FinFET structure disclosed herein. Rather, embodiments of the present disclosure are capable of being implemented in conjunction with any other type of fin-based transistor device now known or later developed.

For the sake of brevity, conventional techniques related to FinFET semiconductor device fabrication may not be described in detail herein. Moreover, the various tasks and process steps described herein may be incorporated into a more comprehensive procedure or process having additional steps or functionality not described in detail herein. In particular, various steps in the manufacture of semiconductor based transistors are well known and so, in the interest of brevity, many conventional steps will only be mentioned briefly herein or will be omitted entirely without providing the well-known process details.

As previously noted herein, replacing the silicon dioxide gate dielectric with another material adds complexity to the manufacturing process. For example, implementing the gate dielectric based on high-k oxides of hafnium requires the poly-silicon gate material to be replaced with a metal that interfaces better with the high-k dielectric. Accordingly, the poly-silicon gate must be etched out and replaced with metal. The metal-gate may be formed before or after the source and drain regions. Forming the metal gate last (i.e., after formation of the source and drain regions) is known generally as a replacement metal gate (RMG) process flow.

Figure 1A:
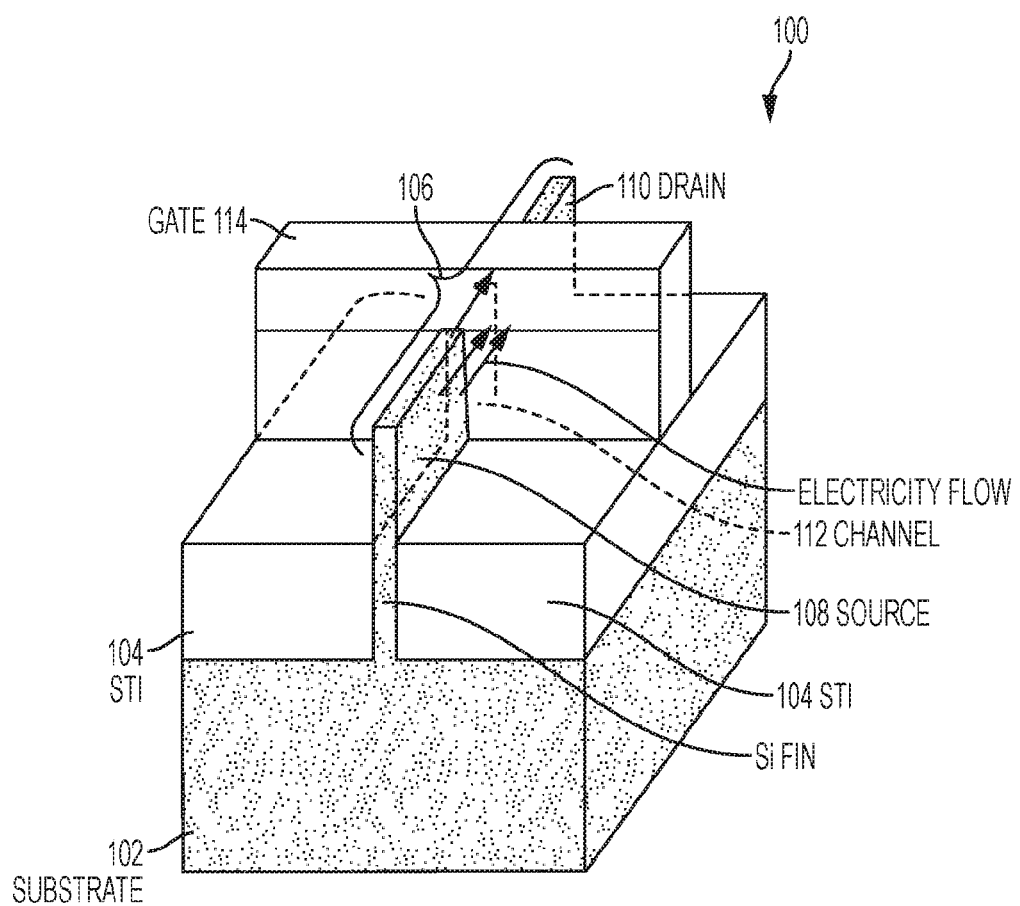
FIG. 1A depicts a three-dimensional view of an exemplary configuration of a known FinFET device.
Figures 1B, 1C:
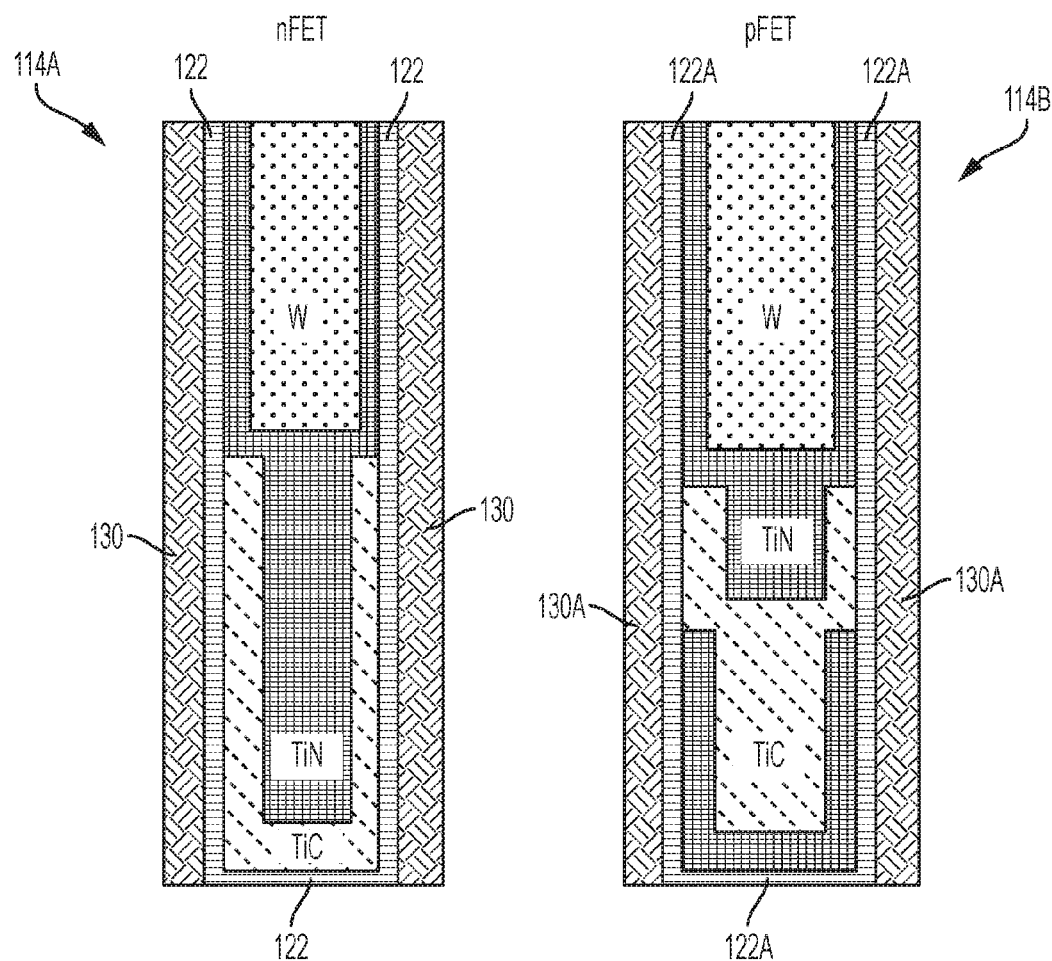
FIG. 1B depicts a cross sectional view of a known final gate structure.
FIG. 1C depicts a cross sectional view of another known final gate structure.

FIGS. 1B and 1C depict cross sectional views of known final (i.e., post fabrication) configurations for gate 114 shown in FIG. 1A. FIG. 1B depicts an n-type FET gate 114A configuration, and FIG. 1B depicts a p-type FET gate 114B configuration. In either configuration, the final gate includes independently optimized complex stacks of thin work-function metals of tungsten (W), titanium nitride (TiN) and titanium carbide (TiC), along with high-k dielectric layers 122, 122A. Known process flows for fabricating gate configurations 114A, 114B form high-k dielectric layers 122, 122A later in the fabrication process, typically after the POC (poly-silicon open CMP) process and before the gate last, RMG process. The RMG process applied to the gate configurations 114A, 114B shown in FIGS. 1B and 1C includes the formation of a dummy gate structure (not shown in FIGS. 1B and 1C) used to self-align the source and drain implant and anneals. The dummy gate materials are then stripped out and replaced with the high-k dielectric and metal gate materials.

A typical fabrication process flow used to form gate configurations 114A, 114B includes multiple anneal operations, including a high-k PDA, a high temperature source drain "activation" anneal applied to the doped source and drain regions to activate these regions, and a subsequent high temperature "reliability" anneal operation applied to high-k dielectric layers 122, 122A to improve the reliability of these layers. Additionally, when formed after the POC process, high-k dielectric layers 122, 122A extend horizontally substantially along elongated surfaces of sidewalls 130, 130A of gates 114A, 114B, which reduces the total volume of the metal gate materials (e.g., W, TiN, TiC, etc.) that can be formed in the gate region between sidewalls 130, 130A.

Turning now to an overview of the present disclosure, one or more embodiments provide a fabrication process flow and resulting device structure of a fin-type field effect transistor (FinFET) that uses a novel "high-k p-type work function metal first" fabrication process that improves the efficiency of source/drain activation annealing and reliability annealing, and also improves the total width (e.g., width 1324 shown in FIGS. 13A and 13B) available for formation of the metal gate materials (e.g., W, TiN, etc.) in the gate region. More specifically, instead of forming a high-k dielectric layer later in the fabrication process flow, one or more disclosed embodiments form the high-k dielectric layer "first," which for a FinFET device means that the high-k dielectric layer is formed before formation of the source drain regions. Additionally, instead of forming all work-function metal gate layers later in the process flow (e.g., during the RMG process) a work-function metal layer (e.g., a cap TiN layer of from about 10 to about 50 Angstroms (Å) in thickness) is deposited over the high-k dielectric layer. Because the high-k dielectric layer is already in place when the source drain regions are formed, the high temperature annealing of both the high-k dielectric layer and the source drain regions can performed as a single annealing operation. Additionally, because a work-function metal layer is in place over the high-k dielectric layer when the source drain regions are formed, the work-function metal protects the high-k dielectric layer during the high temperature annealing of both the high-k dielectric layer and the source drain regions. Further, forming the high-k dielectric layer "first" allows the area occupied by the high-k dielectric layer to be controlled such that the high-k dielectric material does not extend along the sidewalls of the gate structure, which leave more volume between the sidewalls for the formation of the final metal gate structure. Increasing the available volume between the sidewalls for forming the gate structure results in a lower resistance of the resulting gate structure.

Figure 2:
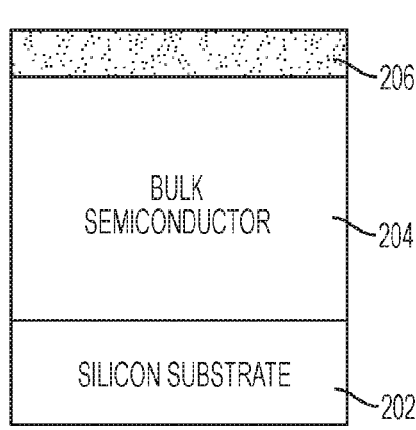
FIG. 2 depicts a semiconductor substrate, a bulk semiconductor material and a hard mask layer after an initial fabrication stage according to one or more embodiments.
Figure 3:
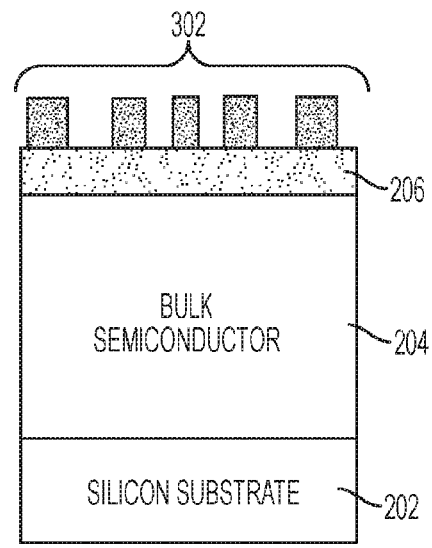
FIG. 3 depicts a cross sectional view of a semiconductor device after an intermediate fabrication stage according to one or more embodiments.
Figure 4:
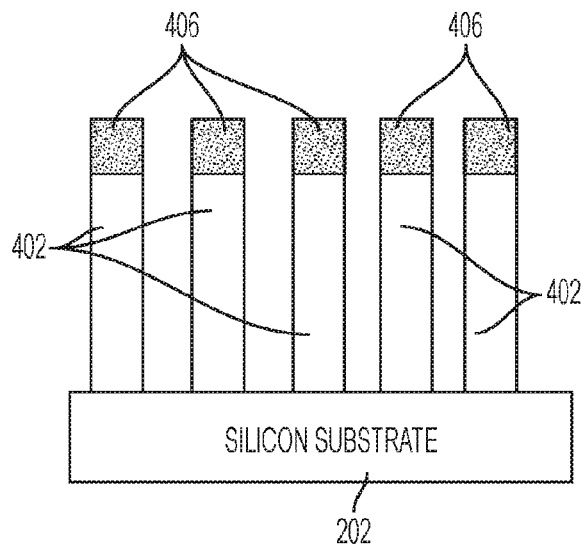
FIG. 4 depicts a cross sectional view of a semiconductor device after an intermediate fabrication stage according to one or more embodiments.
Figure 5:
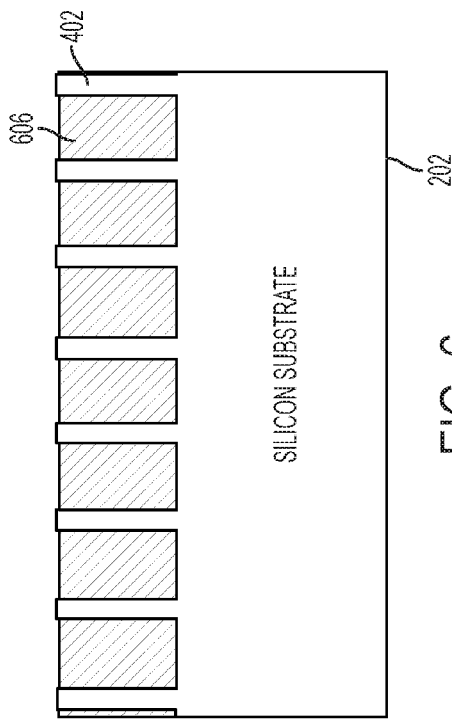
FIG. 5 depicts a cross sectional view of a semiconductor device after an intermediate fabrication stage according to one or more embodiments.
Figure 6:
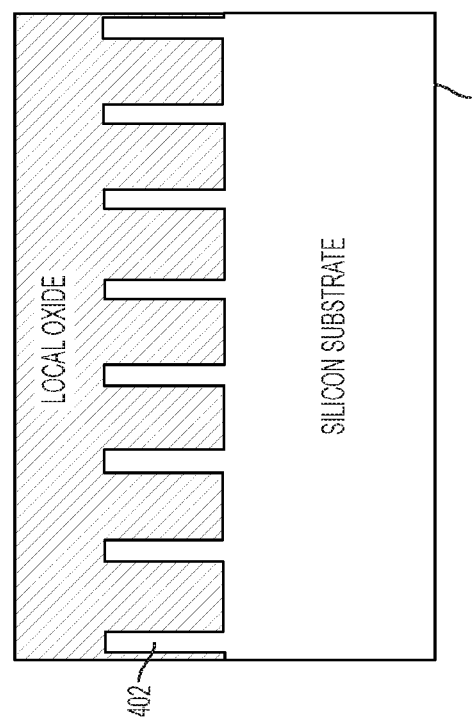
FIG. 6 depicts a cross sectional view of a semiconductor device after an intermediate fabrication stage according to one or more embodiments.
Figure 7:
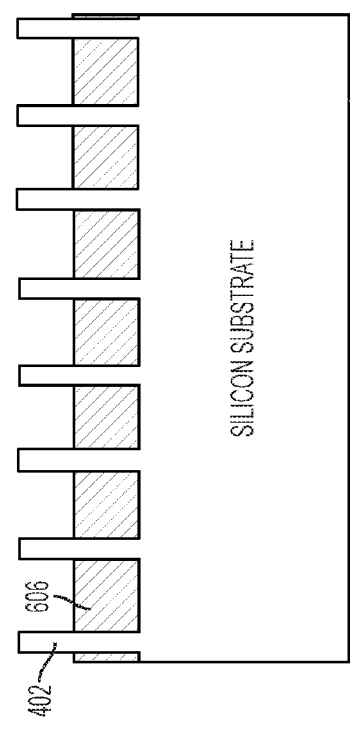
FIG. 7 depicts a cross sectional view of a semiconductor device after an intermediate fabrication stage according to one or more embodiments.

A fabrication methodology for forming various stages of a FinFET semiconductor device in accordance with one or more embodiments of the present disclosure will now be described with reference to FIGS. 2-12. Referring now to FIG. 2, an initial structure is formed having semiconductor substrate 202, a bulk semiconductor material 204 and a hard mask layer 206, configured and arranged as shown. It is noted that bulk semiconductor material 204 and semiconductor substrate 202 may be substantially the same material. Hard mask layer 206 may be a silicon nitride material (e.g., $Si_3N_4$). In FIG. 3, a patterned resist 302 is added over hard mask layer 206 to pattern and form fins 402 (shown in FIG. 4) from bulk semiconductor 204. Fins 402 may be formed by applying an anisotropic etch process, which results in the structure shown in FIG. 4. Because there is no stop layer on semiconductor substrate 202, the etch process is time based. Bulk semiconductor 204 may also be implemented as a silicon-on-insulator (SOI) structure, wherein a buried oxide (BOX) layer of the SOI would act as an etch stop. In FIG. 5, a local oxide (e.g., $SiO_2$) is deposited between fins 402 and over substrate 202. For ease of illustration, only one fin is labeled with a reference number. As shown in FIGS. 6 and 7, the local oxide is polished and recessed back to form local STI regions 606, and to expose upper portions of fins 402. Again, for ease of illustration, only one local STI region is labeled with a reference number.

Figure 8:
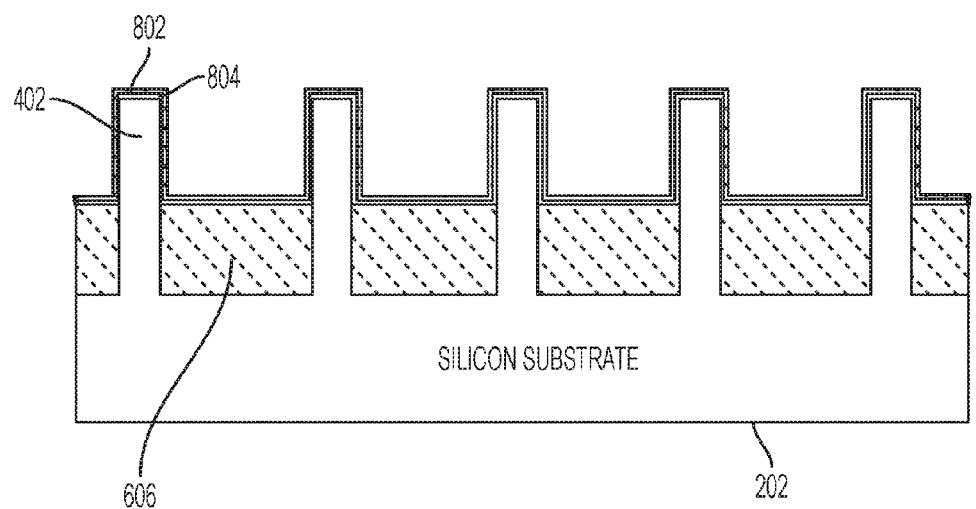
FIG. 8 depicts a cross sectional view of a semiconductor device after an intermediate fabrication stage according to one or more embodiments.
Figures 13A, 13B:
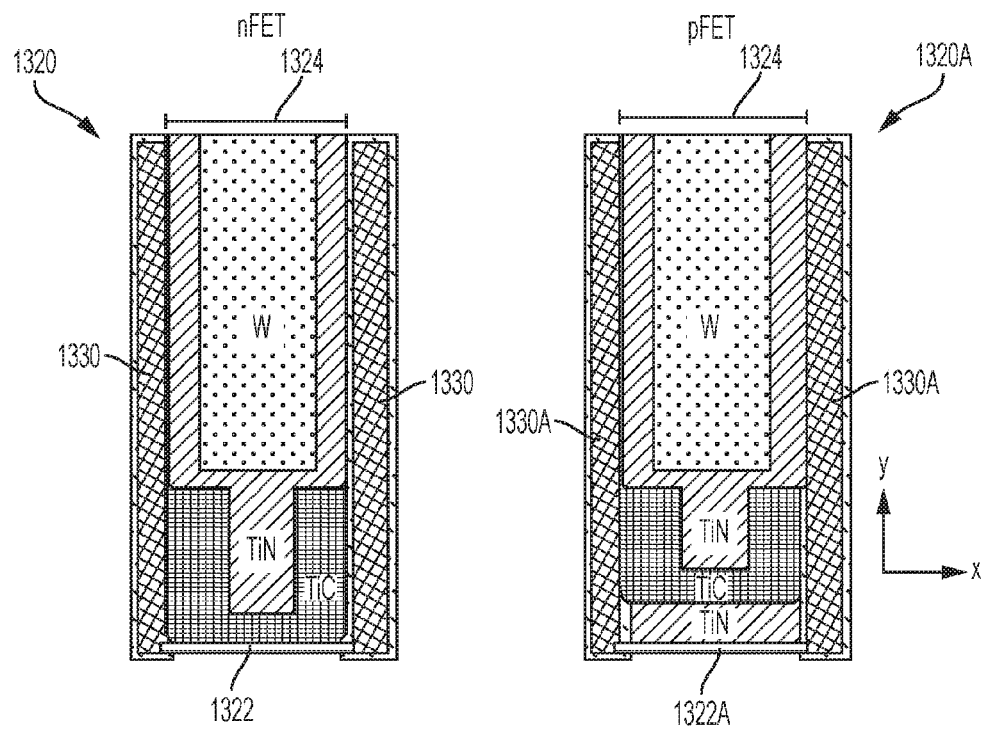
FIG. 13A depicts a cross sectional view of a final gate structure according to one or more embodiments.
FIG. 13B depicts a cross sectional view of a final gate structure according to one or more embodiments.

In FIG. 8, an interfacial/high-k dielectric layer 804 and a TiN layer 802 are deposited over fins 402 and STI 606. For p-type configurations of the present disclosure (e.g., as shown in FIG. 13B and described in greater detail herein below) TiN layer 802 will form part of the work-function layers of the ultimate metal gate structure. TiN layer 802 and a poly-silicon gate/PC layer 902 (shown in FIG. 9A) provide protection for interfacial/high-k dielectric layer 804 and prevent re-growth of interfacial/high-k dielectric layer 804 during subsequent high temperature anneal operations. Interfacial/high-k layer 804 is deposited, followed by a nitridation and a PDA at approximately 700 degrees Celsius for approximately 30 seconds, followed by deposition of a cap TiN layer 802 of from about 10 to about 50 Angstroms (Å) in thickness. In accordance with one or more embodiments, interfacial/high-k layer 804 and TiN layer 802 are formed after fin formation and before the PC module (i.e., gate module) formation, the spacer and epitaxial source/drain formation, and the POC process. This is in contrast to known fabrication methodologies, wherein the interfacial/high-k layer is formed after the PC module formation, the spacer and epitaxial source/drain formation, and the POC process, and wherein the work-function layers are all formed as part of the RMG process.

Figure 9:
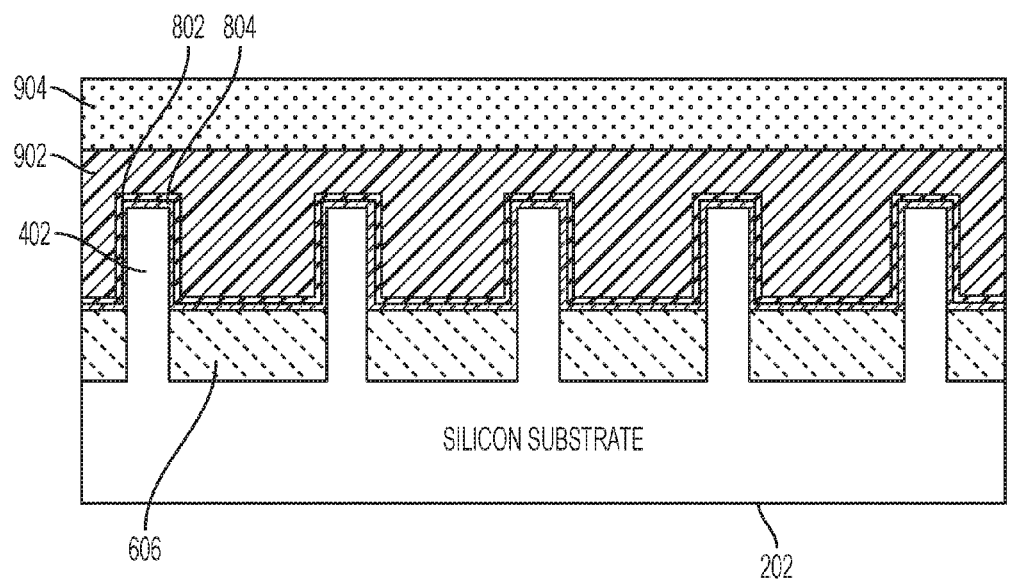
FIG. 9 depicts a cross sectional view of a semiconductor device after an intermediate fabrication stage according to one or more embodiments.

As shown in FIG. 9, poly-silicon gate/PC layers 902 and nitrided hard masks 904 are deposited over TiN layers 802.

Figure 10:
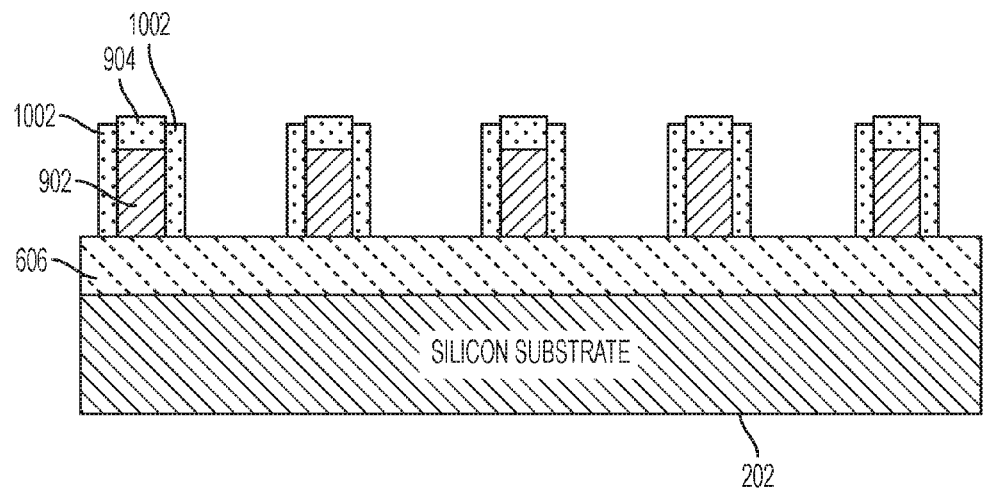
FIG. 10 depicts a cross sectional view of a semiconductor device after an intermediate fabrication stage according to one or more embodiments.

FIG. 10 depicts a cross sectional view of the FinFET device after a subsequent fabrication stage, wherein the device has been rotated by 90 degrees such that fins 402 extend through and between poly-silicon gate/PC layers 902. FIG. 10 depicts the FinFET device after a fabrication stage wherein fins 402, interfacial/high-k layers 804 and TiN layers 802 have been recessed in the areas not covered by poly-silicon gate/PC layers 902, and the only remaining portions of fins 402, interfacial/high-k layers 804 and TiN layers 802 are the portions of fins 402 that form the channel regions, along with the portions of interfacial/high-k layers 804 and TiN layers 802 that cover the fin channel regions. The fin channel regions, interfacial/high-k layers 804 and TiN layers 802 are surrounded by poly-silicon gate/PC layers 902 and are not visible in FIG. 10. Offset spacers 1002 are formed along the sidewalls of poly-silicon gate/PC layers 902, as shown. Offset spacers 1002 may be formed using a spacer pull down formation process. Offset spacers 1002 may also be formed using a sidewall image transfer (SIT) spacer formation process, which includes spacer material deposition followed by directional RIE of the deposited spacer material.

Figure 11:
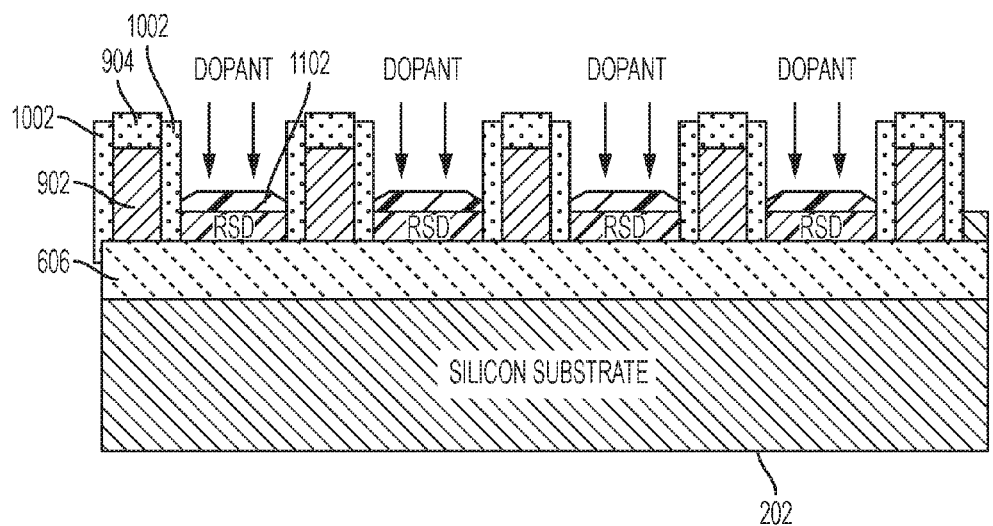
FIG. 11 depicts a cross sectional view of a semiconductor device after an intermediate fabrication stage according to one or more embodiments.

As shown in FIG. 11, raised source drain (RSD) regions 1102 are deposited using an epitaxial layer deposition process. RSD regions 1102 may be suitably doped to produce the desired FET polarity. A high temperature anneal (e.g., from about 1000 to about 1025 degrees Celsius) is now applied. The high temperature anneal may be a spike anneal lasting less than about 1 second. In accordance with one or more embodiments of the present disclosure, because the interfacial/high-k dielectric layers 804 (shown in FIGS. 8 and 9) are already in place when RSD regions 1102 are formed, the high temperature annealing of both the interfacial/high-k dielectric layers 804 and RSD regions 1102 can performed as a single annealing operation. Additionally, because TiN layers 802, which will subsequently function as work-function metal layer, are in place over interfacial/high-k layers 804 when RSD regions 1102 are formed, TiN layers 802 protect interfacial/high-k layers 804 during the high temperature annealing of both interfacial/high-k dielectric layers 804 and RSD regions 1102. Further, forming interfacial/high-k dielectric layers 804 and TiN layers 802 "first" allows the area occupied by interfacial/high-k dielectric layer 804 to be controlled such that interfacial/high-k dielectric layers 804 do not extend along the offset spacers 1002 of the gate structure, which leaves more volume for the formation of the final metal gate structure. Increasing the available volume for forming the metal gate structure results in a lower resistance of the resulting gate structure.

Figure 12:
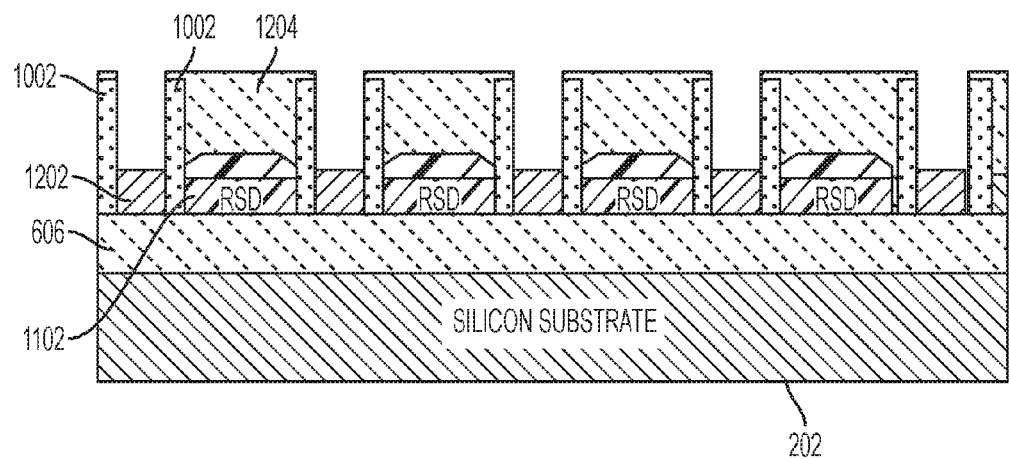
FIG. 12 depicts a cross sectional view of a semiconductor device after an intermediate fabrication stage according to one or more embodiments.

FIG. 12 depicts a stage of the fabrication process flow after the poly open CMP (POC) process but before the metal gate deposition. In a gate-last fabrication process, poly-silicon gate/PC layers 902 comprise a dummy gate structure that may be removed and replaced with a metal gate (e.g., shown in FIGS. 13A and 13B). Poly-silicon gate/PC layers 902 can be removed by an etching process, e.g., RIE or chemical oxide removal (COR), to form a trench. A gate metal (not shown in FIG. 12) can subsequently be deposited within the trench. More specifically, a metal liner, e.g., a work-function metal, and a gate metal can then be deposited on the high-k dielectric material to complete the gate formation. In one or more embodiments, the metal liner can be, for example, TiN or TaN, and the gate metal can be aluminum or tungsten. A silicon dielectric 1204 is deposited over RSD regions 1102.

FIGS. 13A and 13B depict cross sectional views of final (i.e., post fabrication) configurations of gates 1320, 1320A that would result from implementation of one or more embodiments of the high-k p-type work-function metal first fabrication process flow of the present disclosure. FIG. 13A depicts an n-type FET gate 1320 configuration, and FIG. 13B depicts a p-type FET gate 1320A configuration. In either configuration, the final gate includes independently optimized complex stacks of thin work-function metals of tungsten (W), titanium nitride (TiN) and titanium carbide (TiC), along with high-k dielectric layers 1322, 1322A. During fabrication of gates 1320, 1320A, instead of forming the high-k dielectric layer later in the fabrication process flow, one or more disclosed embodiments form the high-k dielectric layer and a TiN work-function layer "first," which for a FinFET device means that the high-k dielectric layers 1322, 1322A and TiN work-function layer (shown for the pFET gate configuration 1320A in FIG. 13B) are formed before formation of the source drain regions. For the nFET gate configuration 1324 shown in FIG. 13A, the TiN layer has been etched away in the final gate configuration. Because the high-k dielectric layers 1322, 1322A and TiN work-function layer are already in place when the source drain regions are formed, the high temperature annealing operation of both the high-k dielectric layers 1322, 1322A and the source drain regions can be performed as a single annealing operation. Additionally, because the TiN layer, which in the final gate configuration functions as part of the work-function metal layers, is in place over high-k layers 1322, 1322A when RSD regions 1102 (shown in FIGS. 11 and 12) are formed, TiN layer protects high-k layers 1322, 1322A during the high temperature annealing of both high-k dielectric layer 1322, 1322A and RSD regions 1102. Additionally, forming the high-k dielectric layer and TiN work-function layer "first" allows the area or volume occupied by the high-k dielectric layers 1322, 1322A to be controlled such that the high-k dielectric material does not extend substantially along elongated surfaces of sidewalls 1330, 1330A of the gate structure, which leaves more volume for the formation of the final metal gate structure. Increasing the available volume for forming the gate structure results in a lower resistance of the resulting gate structure. The elongated surfaces of sidewalls 1330, 1330A extend for a dimension that is significantly more than a width dimension of sidewalls 1330, 1330A.

FIG. 13B includes an additional legend showing an x-y axis of the cross-sectional view of gate configurations 1320, 1320A shown in FIGS. 13A and 13B, which may be used to further illustrate that high-k dielectric layers 1322, 1322A do not extend substantially along an elongated surface of sidewalls 1330, 1330A. This legend also applies to gate configurations 114A, 114B shown in FIGS. 1B and 1C. As illustrated, high-k dielectric layers 1322, 1322A extend substantially along an x direction of gate configurations 1320, 1320A but do not extend substantially along a y direction of gate configurations 1320, 1320A. In contrast, the prior art gate configurations 114A, 114B include high-k dielectric layers 122, 122A that extend substantially along an x direction of gate configurations 114A, 114B and substantially along a y direction of gate configurations 114A, 114B.

Figure 14:
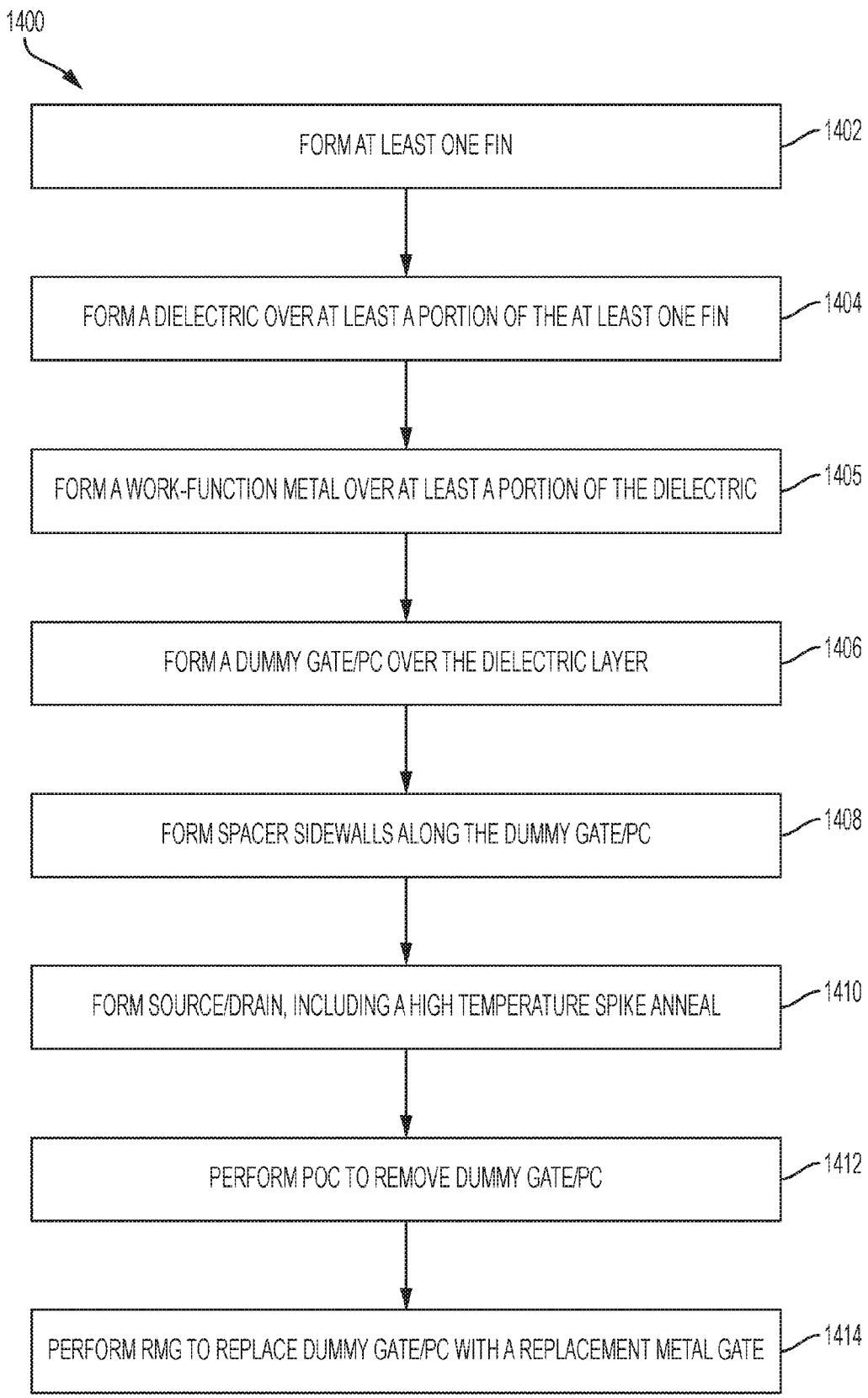
FIG. 14 is a flow diagram illustrating a methodology according to one or more embodiments.

FIG. 14 is a flow diagram illustrating a methodology 1400 according to one or more embodiments. Although the operations of methodology 1400 are illustrated in a particular order, it will be understood by persons of ordinary skill in the relevant art that the order of the illustrated operations may be changed without departing from the teachings of the present disclosure. In addition, it will be understood by persons of ordinary skill in the relevant art that one or more of the illustrated operations may be omitted, and/or operations not shown (e.g., routine intermediary operations) may be incorporated, without departing from the teachings of the present disclosure.

As shown in FIG. 14, methodology 1400 begins at block 1402 by forming at least one fin. Block 1404 forms a dielectric layer (e.g., a high-k dielectric) over at least a portion of the at least one fin. The dielectric layer may include an interfacial layer. Block 1404 may include a post deposition anneal operation, which may be performed at approximately 700 degrees Celsius for approximately 30 seconds. Block 1405 deposits a work-function metal layer (e.g., a cap TiN layer of from about 10 to about 50 Angstroms (Å) in thickness) over the high-k dielectric layer. Block 1406 forms a dummy gate/PC over the dielectric layer, and block 1408 forms spacer sidewalls along the dummy gate/PC. Block 1410 forms the source/drain regions and performs an anneal operation. The anneal operation is a high temperature anneal, which includes a temperature above about 1000 Celsius. The anneal operation may be a spike anneal operation that lasts less than approximately 1 second. In accordance with one or more embodiments of the present disclosure, because the high-k dielectric layer is already in place when the source/drain regions are formed, the high temperature anneal operation anneals both the high-k dielectric layer and the source/drain regions in a single, spike annealing operation. Additionally, because the work-function metal layers are is in place over the dielectric layer when the source/drain regions are formed, the work-function metal layer protects the dielectric layer during the high temperature annealing of both the dielectric layer and the source/drain regions. Further, forming high-k dielectric layer and at least one of the work-function layers "first" allows the area occupied by high-k dielectric layer 804 to be controlled such that the high-k dielectric layer does not extend substantially along an elongated surface of the spacers that define the gate structure, wherein more volume is available for the formation of the final metal gate structure. Increasing the available volume for forming the gate structure results in a lower resistance of the resulting gate structure. Block 1412 performs a POC process to remove the poly-silicon dummy gate/PC, and block 1414 performs a known RMG process that replaces the poly-silicon dummy gate/PC with a metal gate.

In an alternative embodiment, the high temperature anneals are combined into a single anneal and performed at some point in the process after the high-k dielectric layer has been deposited and the source drain regions have been formed, and the other fabrication steps shown in FIG. 14 may be performed in any order.

Thus, it can be seen from the forgoing detailed description and accompanying illustrations that embodiments of the present disclosure provide structures and methodologies for forming a high-k dielectric region of a FinFET device having improved reliability annealing and source drain activation annealing. As described above, one or more embodiments provide a fabrication process flow and resulting device structure of a fin-type field effect transistor (FinFET) that uses a novel "high-k p-type work-function first" fabrication process that improves the efficiency of source/drain activation annealing and reliability annealing, and also increases the total volume available for formation of the replacement metal gate in the gate region. More specifically, instead of forming a high-k dielectric layer and at least one of the work-function layers later in the fabrication process flow, one or more disclosed embodiments form the high-k dielectric layer and at least one of the work-function layers "first," which for a FinFET device means that the high-k dielectric layer and at least one of the work-function layers are formed before formation of the source drain regions. Because the high-k dielectric layer and at least one of the work-function layers are already in place when the source drain regions are formed, the high temperature annealing of both the high-k dielectric layer and the source drain regions can performed as a single annealing operation. Additionally, forming the high-k dielectric layer "first" allows the area occupied by the high-k dielectric layer to be controlled such that the high-k dielectric material does not extend along the sidewalls of the gate structure, which leave more volume for the formation of the final metal gate structure. Increasing the available volume for forming the gate structure results in a lower resistance of the resulting gate structure.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A fin-type field effect transistor (FinFET) device comprising:
    a channel region comprising at least one fin comprising a semiconductor material, wherein the at least one fin is formed over a substrate having a major surface;
    a first sidewall formed over the substrate and having a first elongated sidewall surface extending in a y-direction that is substantially perpendicular with respect to the major surface of the substrate;
    wherein the first sidewall further extends along sidewalls and a top surface of the at least one fin;
    a second sidewall formed over the substrate and having an elongated second sidewall surface extending in the y-direction;
    wherein the second sidewall further extends along sidewalls and the top surface of the at least one fin;
    a gate region defined at least in part by a space between the elongated first sidewall surface and the elongated second sidewall surface;
    wherein the gate region includes:
    a dielectric layer over at least a portion of the at least one fin; and
    a work-function metal layer formed over at least a portion of the dielectric layer;
    wherein the dielectric layer does not extend substantially along the first elongated sidewall surface;
    wherein the dielectric layer does not extend substantially along the second elongated sidewall surface.

2. The device of claim 1, wherein the dielectric layer comprises an oxide of hafnium.

3. The device of claim 1, wherein the dielectric layer includes an interfacial layer.

4. The device of claim 1 further comprising:
    a source region or a drain region adjacent the at least one fin;
    wherein, during a fabrication of the device, one anneal operation annealed the dielectric layer and the source region or the drain region; and
    wherein, during the one anneal operation, the work function layer provides a protection function to the at least a portion of the dielectric layer.

5. The device of claim 4, wherein the anneal operation comprises a temperature above about 1000 degrees Celsius.

6. The device of claim 5, wherein the anneal operation comprises a duration less than about 1 second.

7. The device of claim 1, wherein the gate region comprises a metal.

8. The device of claim 7, wherein the metal comprises tungsten.

9. The device of claim 7, wherein the metal comprises titanium nitride.

10. The device of claim 7, wherein the metal comprises titanium carbide.

11. A fin-type field effect transistor (FinFET) device comprising:
    a channel region comprising at least one fin comprising a semiconductor material, wherein the at least one fin is formed over a substrate having a major surface;
    a first sidewall formed over the substrate and having a first elongated sidewall surface extending in a y-direction that is substantially perpendicular with respect to the major surface of the substrate;
    wherein the first sidewall further extends along sidewalls and a top surface of the at least one fin;

a second sidewall formed over the substrate and having an elongated second sidewall surface extending in the y-direction;
wherein the second sidewall further extends along sidewalls and the top surface of the at least one fin;
a gate region defined at least in part by a space between the elongated first sidewall surface and the elongated second sidewall surface;
wherein the gate region includes:
a dielectric layer formed over at least a portion of the at least one fin; and
a work function layer formed over at least a portion of the dielectric layer, wherein the work function layer is configured to provide a protection function to the at least a portion of the at least one fin;
wherein the dielectric layer does not extend substantially along the first elongated surface;
wherein the dielectric layer does not extend substantially along the second elongated sidewall surface.

12. The device of claim 11, wherein the dielectric layer comprises an oxide of hafnium.

13. The device of claim 11, wherein the dielectric layer includes an interfacial layer.

14. The device of claim 11 further comprising:
a source region or a drain region adjacent the at least one fin;
wherein, during a fabrication of the device, one anneal operation annealed the dielectric layer and the source region or the drain region; and
wherein, during the one anneal operation, the work function layer provides a protection function to the at least a portion of the dielectric layer.

15. The device of claim 14, wherein the anneal operation comprises a temperature above about 1000 degrees Celsius.

16. The device of claim 15, wherein the anneal operation comprises a duration less than about 1 second.

17. The device of claim 11, wherein the gate region comprises a metal.

18. The device of claim 17, wherein the metal comprises tungsten.

19. The device of claim 17, wherein the metal comprises titanium nitride.

20. The device of claim 17, wherein the metal comprises titanium carbide.

* * * * *